(12) United States Patent
Guerrini et al.

(10) Patent No.: US 9,247,169 B2
(45) Date of Patent: Jan. 26, 2016

(54) IMAGING SENSOR DEVICE (71) Applicant: THE SCIENCE AND TECHNOLOGY FACILITIES COUNCIL, Didcot, Oxfordshire (GB)

(72) Inventors: Nicola Guerrini, Didcot (GB); Iain Sedgwick, Didcot (GB); Renato Turchetta, Didcot (GB)

(73) Assignee: THE SCIENCE AND TECHNOLOGY FACILITIES COUNCIL, Didcot, Oxfordshire (GB)

( * ) Notice: Subject to any disclaimer, the term of this patent is extended or adjusted under 35 U.S.C. 154(b) by 0 days.

(21) Appl. No.: 14/414,217

(22) PCT Filed: Jul. 17, 2013

(86) PCT No.: PCT/GB2013/051911
§ 371 (c)(1),
(2) Date: Jan. 12, 2015

(87) PCT Pub. No.: WO2014/013251
PCT Pub. Date: Jan. 23, 2014

(65) Prior Publication Data
US 2015/0189208 A1 Jul. 2, 2015

(30) Foreign Application Priority Data
Jul. 18, 2012 (GB) .................................. 1212769.2

(51) Int. Cl.
*H04N 5/335* (2011.01)
*H04N 5/374* (2011.01)
(Continued)

(52) U.S. Cl.
CPC .......... *H04N 5/374* (2013.01); *H01L 27/14603* (2013.01); *H01L 27/14609* (2013.01); *H01L 27/14612* (2013.01); *H01L 27/14636* (2013.01);
(Continued)

(58) Field of Classification Search
CPC .................................................... H04N 5/374
USPC ......................... 348/308, 281, 262, 272, 294
See application file for complete search history.

(56) References Cited

U.S. PATENT DOCUMENTS

| 6,605,488 | B1 | 8/2003 | Andersson |
| 2004/0150735 | A1 | 8/2004 | Tsai |

(Continued)

FOREIGN PATENT DOCUMENTS

| EP | 1 049 171 | 11/2000 |
| EP | 1 835 733 | 9/2007 |
| WO | WO 2010/066559 | 6/2010 |

*Primary Examiner* — Usman Khan
(74) *Attorney, Agent, or Firm* — Preti Flaherty Beliveau & Pachios LLP (57) ABSTRACT

An imaging sensor device has an array of pixel sensors in rows and columns. The array comprises: a plurality of stitching blocks, each comprising a plurality of pixel sensors disposed in at least one row group; and first and second groups of addressing lines, the arrangement of pixel sensors and addressing lines in each stitching block being the same. Row addressing circuitry is disposed along an external edge of the array parallel to the rows of pixel sensors, coupled to the pixel sensors using the first group of addressing lines for performing a row addressing action and group addressing circuitry is disposed along the same edge of the array, coupled to the pixel sensors using at least some of the second group of addressing lines for performing a group addressing action. Each stitching block combines a row addressing action with a group addressing action to select only one row of one row group of one stitching block simultaneously.

18 Claims, 8 Drawing Sheets (51) Int. Cl.
*H01L 27/146* (2006.01)
*H04N 5/347* (2011.01)
*H04N 5/376* (2011.01)

(52) U.S. Cl.
CPC .... *H01L 27/14643* (2013.01); *H01L 27/14689* (2013.01); *H04N 5/347* (2013.01); *H04N 5/376* (2013.01)

(56) References Cited

U.S. PATENT DOCUMENTS

| 2006/0243883 A1* | 11/2006 | Yahazu | H04N 5/347 250/208.1 |
| 2007/0080916 A1 | 4/2007 | Nascetti et al. | |
| 2009/0179141 A1 | 7/2009 | Sarig et al. | |

* cited by examiner

| EDGE CIRCUITRY | EDGE CIRCUITRY | EDGE CIRCUITRY | |
|---|---|---|---|
| PIXEL ARRAY | PIXEL ARRAY | PIXEL ARRAY | N SENSORS ... |
| PIXEL ARRAY | PIXEL ARRAY | PIXEL ARRAY | N SENSORS ... |
| EDGE CIRCUITRY | EDGE CIRCUITRY | EDGE CIRCUITRY | |

Fig. 8

IMAGING SENSOR DEVICE

TECHNICAL FIELD OF THE INVENTION

The invention relates to an imaging sensor device, a composite imaging sensor device and methods of manufacturing such an imaging sensor device and composite imaging sensor device.

BACKGROUND OF THE INVENTION

Imaging sensor arrays are used in a large variety of different applications. In some applications, a large array area size is desirable, for example medical X-ray imaging, telescope focal planes and X-ray detectors in a synchrotron. In practice, such a large detection area may be achieved by tiling several smaller detector units. To avoid the loss of parts of the image, the gaps between each individual unit should be as small as possible.

Figure 1:
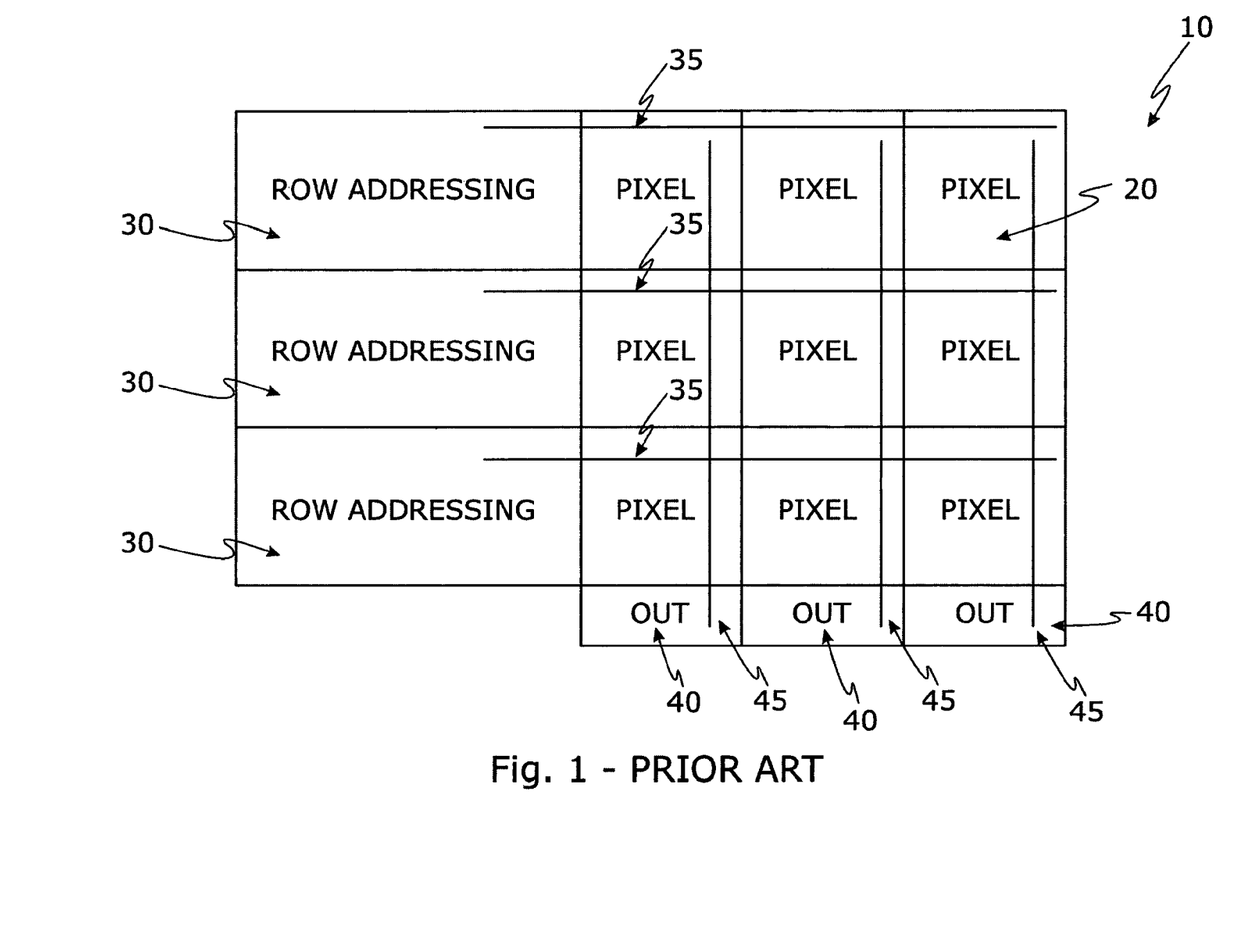
FIG. 1 shows a known type of CMOS imaging sensor.

Often, CMOS image sensors or semiconductor detectors bump-bonded to a CMOS readout chip are used. A CMOS imaging sensors (CIS) is a pixelated electronic device which can sense electromagnetic radiation (often light) and translate this into a readable output voltage. In a standard CIS, each pixel converts received radiation to voltage and stores it until a read-out phase. FIG. 1 shows a known type of CIS 10. This comprises: a plurality of pixels 20; row addressing circuitry 30; row addressing signal lines 35; read-out circuitry 40; and read-out lines 45. During read-out, a row is addressed using the row circuitry 30 which is located along one edge of the device. All pixels in that row are read out along a respective column read-out line 45. Each pixel in a different column is coupled to the same read-out line 45. In order to produce a uniform image, all of the pixels are desirably identical.

In the CMOS part of the detector, control and read-out electronics is therefore typically provided on at least two sides of the sensor array. Read-out amplifiers and column controlled circuitry are often provided on the bottom of the array and row addressing circuits are often provided on the left-hand side, as shown in FIG. 1. In view of the circuitry present on these two sides, any attempt to tile sensor arrays using these sides will result in significant gaps in the resultant composite array. If the sensor arrays are square and only a 2×2 tiling is necessary, these gaps do not cause a problem.

Nevertheless, larger imaging sensors are increasingly desirable. This is difficult to achieve in view of the limitations discussed above. A known approach to increase the number of buttable sides (that is, sides of the pixel array along which no circuitry is placed and which can therefore abut other sensor arrays to create a composite device) is to place the addressing circuitry and read-out circuitry along the same edge of the pixel array. For example, U.S. Pat. No. 7,009,646 considers such an approach.

To create even larger composite sensors, the individual sensor arrays making up the composite should preferably be as large as possible themselves. The largest possible sensors are the size of a full CMOS wafer and are called wafer-scale. Such large-scale individual devices are produced using a process known as stitching. Identical blocks of circuitry are repeated across the sensor. Selecting a single row of pixel sensors when all of the circuitry blocks are the same creates significant difficulties.

When stitching is combined with the strategy of placing all electronic circuitry on only one edge of the sensor array, there is a further challenge. Devices where row addressing can be carried out essentially using horizontal lines and read-out essentially using vertical lines have a symmetrical nature. When all of the electronic circuitry is placed along a single edge, both addressing and read-out rely on lines with the basically same orientation. A repeatable arrangement of pixel sensors and addressing lines from which a single row can be selected is not easy. Moreover, it is desirable that the sensor array be produced using as few different types of repetition unit (known as stitching blocks) as possible. This not only results in a device that is easier and less costly to manufacture, but also improves the likelihood that each pixel sensor will be the same. Image quality is improved thereby. Achieving all of these aims remains a difficulty.

SUMMARY OF THE INVENTION

Against this background, the present invention provides an imaging sensor device, comprising: an array of pixel sensors arranged in rows and columns, the array comprising: a plurality of stitching blocks, each stitching block comprising a plurality of pixel sensors disposed in at least one row group; and first and second groups of addressing lines for addressing the pixel sensors, the arrangement of pixel sensors and addressing lines in each of the stitching blocks being the same; row addressing circuitry external to the array, disposed along an edge of the array parallel to the rows of pixel sensors, coupled to the pixel sensors using the first group of addressing lines and configured to perform a row addressing action in which a single corresponding row in each of the row groups of each stitching block is simultaneously addressed; and group addressing circuitry external to the array, disposed along the same edge of the array as the row addressing circuitry, coupled to the pixel sensors using at least some of the second group of addressing lines and configured to perform a group addressing action in which all of the rows in a single row group of a single stitching block are simultaneously addressed. Each stitching block is further arranged to combine a row addressing action with a group addressing action such that only one row of one row group of one stitching block is selected simultaneously.

Thus, two addressing lines are used to address a single row of pixel sensors. The pixel sensors are advantageously divided into row groups across all of the stitching blocks, each row group may comprise a plurality of pixel sensors across a plurality of rows and at least one column. Each row group preferably has its own addressing signal. Moreover, an addressing signal is also provided to identify a row within a row group. That addressing signal may therefore be provided to every row group. The first group of addressing lines provide the row addressing signal and the second group of addressing lines provide the row group addressing signal.

It has been recognised that using only one signal to address the pixels of a single row results in a sensor that is not possible to fabricate using a single repeating unit, when all of the addressing circuitry is placed along one edge of the sensor array. In contrast, the use of two addressing signals for identifying a row makes such a structure possible.

Preferably, each stitching block comprises a plurality of second addressing line segments, at least some of which are each arranged to couple with a respective second addressing line segment of an adjacent stitching block. The second addressing line segments coupled form the second group of addressing lines. Hence, each stitching block is designed to match both to the stitching block placed immediately below it and to the stitching block placed immediately above it, if any. Even then, the stitching blocks are identical in terms of their addressing line segments. This allows a large structure to be built up from smaller identical pieces.

More preferably, each row group has a single respective second addressing line segment coupled to it in each stitching block. The other second addressing line segments in a stitching block may each be configured to couple with a respective second addressing line segment in a stitching block placed above. This may result in a stitching block pattern in which those second addressing line segments that are configured to couple to a respective second addressing line segment in another stitching block having a configuration in which the starting point of the segment at the bottom of the stitching block and the end point of the segment at the top of the stitching block are laterally displaced. This may result in the second addressing line segment being step-shaped or diagonal in nature.

Advantageously, the stitching blocks are arranged in at least one column. In this context, a column should be understood as referring the stitching blocks, rather than the pixel sensors. Then, the number of row groups in the column of stitching blocks may be no greater than the number of second addressing line segments in each stitching block. This may apply if each row group is to be individually addressed. It may be considered that the number of second addressing line segments in a stitching block that are coupled to a row group is the same as the number of row groups in a stitching block. Moreover, it may be understood that the stitching block closest to the row addressing circuitry and group addressing circuitry may require at least the same number of second addressing line segments as there are row groups in the whole column. Since each of the stitching blocks have the same pattern of second addressing line segments, it may be appreciated that the number of second addressing line segments in a stitching block limits the number of row groups that can be provided in the column. Optionally, some of the second addressing line segments may not be coupled either to any pixel sensors in a stitching block or to other addressing line segments that are coupled to pixel sensors. In some embodiments, the second group of addressing lines may be configured such that a single second addressing line is coupled to more than one row group.

Advantageously, each of the pixel sensors is made using CMOS transistors. Optionally, each of the pixel sensors is an active pixel sensor, although passive pixel sensors can alternatively be used.

Combining the row addressing action with the group addressing action may be achieved using logic circuitry, such as a logic gate. For example, each stitching block may further comprise a logic gate for each pixel sensor of the stitching block. This logic gate may be coupled to a respective one of the first group of addressing lines and the respective one of the second group of addressing lines. In this way, a single addressing signal may be provided to each pixel sensor, despite the fact that two addressing signals are provided from the addressing circuitry that is external to the array. Unlike some known imaging sensors, this means that some of the logic circuitry is provided within the pixel sensors. As a result, a portion of the pixel sensor array is used for addressing circuitry, reducing the sensitivity of the overall pixel sensor. This portion can be kept small. Nevertheless, some image degradation may then result, but this can be mitigated. Beneficially, the position of the plurality of logic gates in relation to their associated pixel sensor of the stitching block may not all be the same. If the position of the logic gates were all the same, a pattern may be noticeable on the image. Desirably though, the arrangement of logic gates within a stitching block is the same for each stitching block. Preferably, the positions of the plurality of logic gates in each stitching block are distributed pseudo-randomly. This may result in improved image quality, as compensation for random or pseudo-random degradations can be made more effectively than for degradations in a pattern.

The row addressing circuitry and group addressing circuitry may be provided using separate functional elements or as part of an integrated logic or circuit structure.

Optionally, each stitching block comprises a plurality of pixel sensors disposed in one row group. In such cases, the group addressing circuitry is configured to form a group addressing action in which all of the rows in a stitching block are simultaneously addressed. Then, second groups of addressing lines may be configured such that only one second addressing line is coupled to the pixel sensors in each stitching block.

In a preferred embodiment, the array of pixel sensors further comprises a group of read-out lines. Then, each read-out line may be arranged to provide a combined signal from a single pixel sensor of each of a plurality of rows in the array. More preferably, each read-out line is arranged to provide a combined signal from a single pixel sensor of each row in the array. Then, the selection of only one row of one row group of one stitching block by the combination of a row addressing action with a group addressing action means that only the signals from that selected row are provided on the group of read-out lines. Alternative configurations of read-out lines are possible. For example, there may be multiple groups of read-out lines. Each group of read-out lines may be configured to provide combined signals from one or more rows of pixel sensors. The one or more rows of pixel sensors preferably come from multiple row groups. Advantageously, the arrangement of read-out lines in each of the stitching blocks is the same. As above, this may mean that the fabrication of the stated device is made more straightforward and less costly, since a large number (or even all) of the stitching blocks may be made in exactly the same way. For example, the same photolithography process may be used (with the same mask or masks).

Preferably, read-out circuitry is provided external to the array. This is advantageously disposed along the same edge of the array of the row addressing circuitry (and the group addressing circuitry) and coupled to the pixel sensors using the group of read-out lines.

Beneficially, most circuitry is disposed adjacent to the edges of the pixel array other than the edge along which the row addressing circuitry is disposed. As detailed before, the group addressing circuitry is disposed along the same edge as the row addressing circuitry and, optionally, read-out circuitry is also disposed along the same edge. Since all of the circuitry is disposed along one edge, the other three edges of the pixel array are buttable. Then, a composite imaging sensor device may comprise a first array of pixel sensors as described above and at least one further array of pixel sensors are positioned to abut the first array of pixel sensors along a common edge, the common edge being an edge having no circuitry disposed adjacent to it. In this way, a 2×N composite pixel sensor array can be fabricated, where N is any integer.

Optionally, the array of pixel sensors may further comprise a third group of addressing lines for addressing the pixel sensors. Then, the group addressing circuitry may be further coupled to the pixel sensors using at least some of the third group of addressing lines and may be configured to perform a second group addressing action using the third group of addressing lines in which all of the rows in a single row group of a single stitching block are simultaneously addressed. Moreover, each stitching block may then be further arranged to combine a row addressing action with a second group addressing action such that only one row of one row group of one stitching block is selected simultaneously. Beneficially, the first group addressing action and the second group addressing action may be effected simultaneously. In some embodiments, the combination of the row addressing action and the second group addressing action may cause pixel sensors in the selected row to be reset.

In another aspect, the present invention provides a composite imaging sensor device, comprising a plurality of imaging sensor devices arranged in opposing pairs, each imaging sensor device being as described above. Thus, a 2×N composite imaging sensor array may be provided thereby.

In a further aspect of the present invention, there may be provided a method of operating an imaging sensor device, the imaging sensor device being provided as described above. Then, a method of operating the imaging sensor device may comprise: configuring the row addressing circuitry to perform a row addressing action; configuring the group addressing circuitry to form a group addressing action; and carrying out a read-out, so as to read-out the selected row of the row group of the stitching block.

In another aspect, there is a method of providing an imaging sensor device, comprising: arranging pixel sensors in an array of row and column, the array comprising: a plurality of stitching blocks, each stitching block comprising a plurality of pixel sensors disposed in at least one group; and first and second groups of addressing lines for addressing the pixel sensors, the arrangement of pixel sensors and addressing lines in each of the processing blocks being the same; providing row addressing circuitry external to the array, disposed along an edge of the array parallel to the rows of pixel sensors, coupled to the pixel sensors using the first group of addressing lines and configured to perform a row addressing action in which a single corresponding row in each of the row groups of each stitching block is simultaneously addressed; and group addressing circuitry external to the array, disposed along the same edge of the array as the row addressing circuitry, coupled to the pixel sensors using at least some of the second group of addressing lines and configured to perform a group addressing action in which all of the rows in a single row group of a single stitching block are simultaneously addressed. Each stitching block is further arranged to combine a row addressing action with a group addressing action, such that only one row of one row group of one stitching block is selected simultaneously.

The method of providing an imaging sensor device may have further method steps so as to provide any of the features described in connection with the imaging sensor device described above. Moreover, a composite imaging sensor device may be provided by arranging a plurality of such imaging sensor devices in opposing pairs.

Optionally, the method of providing an imaging sensor device may be such that the step of arranging pixel sensors comprises forming at least some of the plurality of stitching blocks using identical processing steps. In the preferred embodiment, the at least some of the plurality of stitching blocks are formed using the same photolithographic process. Advantageously, the same photolithographic process may mean that the same mask or masks are used.

It will be understood that any combination or sub-combination of the individual apparatus features or method features described may be implemented, even though not explicitly disclosed.

BRIEF DESCRIPTION OF THE DRAWINGS

The invention may be put into practice in various ways, a number of which will now be described by way of example only and with reference to the accompanying drawings in which.

DETAILED DESCRIPTION OF PREFERRED EMBODIMENTS

Figure 2:
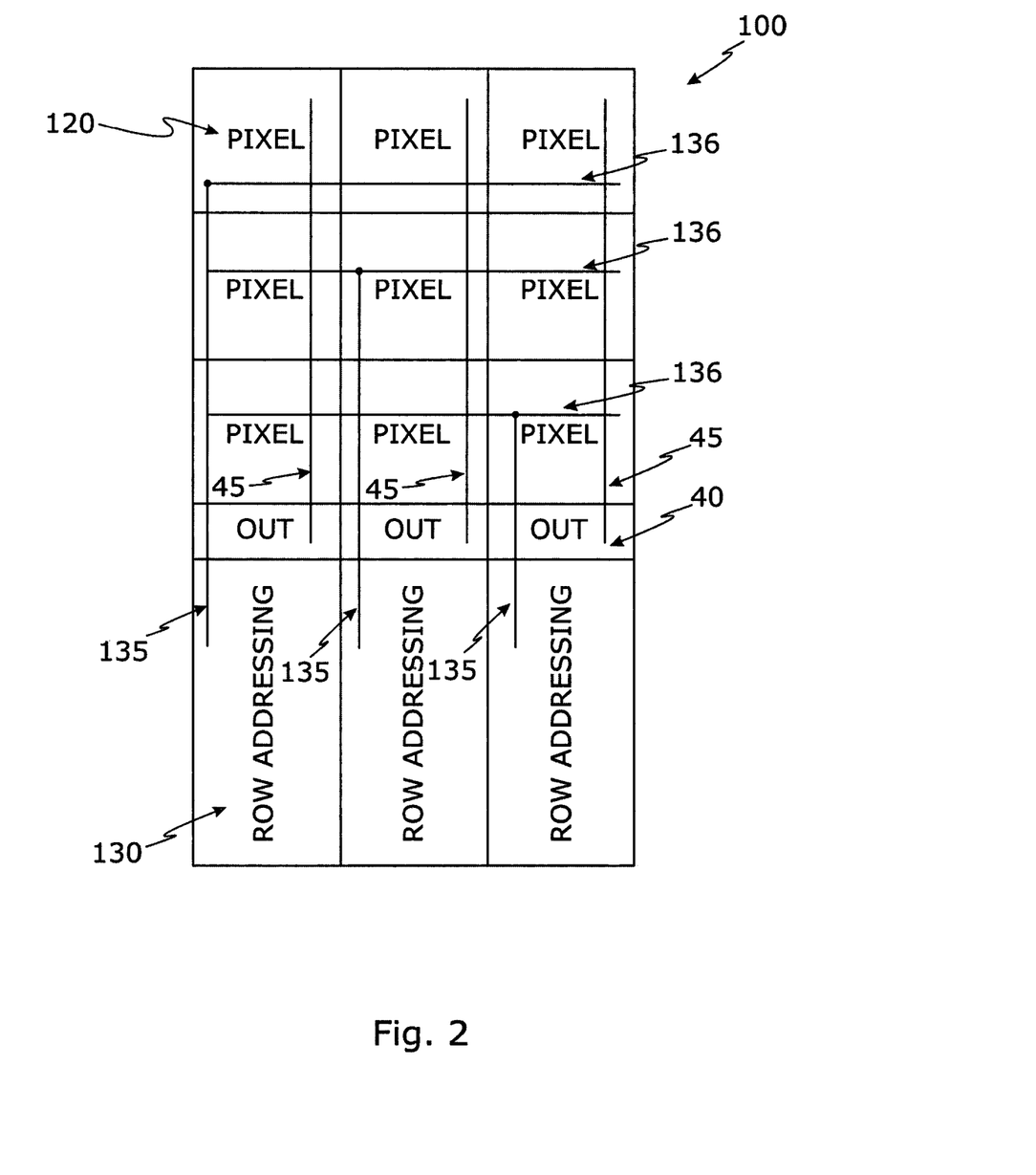
FIG. 2 depicts part of an imaging sensor device in accordance with the present invention.

Referring first to FIG. 2, there is shown an imaging sensor device 100 in accordance with the present invention. Where the same features are described as shown in connection with FIG. 1, identical reference numerals have been used. The imaging sensor device 100 comprises: a plurality of pixel sensors 120 in an array; vertical row addressing lines 135; horizontal row addressing lines 136; row addressing circuitry 130; read-out lines 45; and read-out circuitry 40. The plurality of pixel sensors 120 are CMOS.

The row addressing circuitry 130, which would normally be placed along a vertical side of the sensor array 100 (as shown in FIG. 1) is moved to the bottom edge. Row selecting signals are then run up the chip using vertical row addressing lines 135 and turned through 90 degrees using horizontal row addressing lines 136 to run to every pixel in a row. This allows the pixel sensors 120 to extend fully to three edges of the imaging sensor device 100. Each of the read-out lines 45 allows signals from every pixel sensor in a respective column to be read-out via the read-out circuitry 40. However, if this design is implemented using stitching blocks, with the rows being selected only using the vertical row addressing lines 135 and horizontal row addressing lines 136, it is desirable to avoid one or more rows in every stitching block being selected. This may lead to corrupted data.

Figure 3:
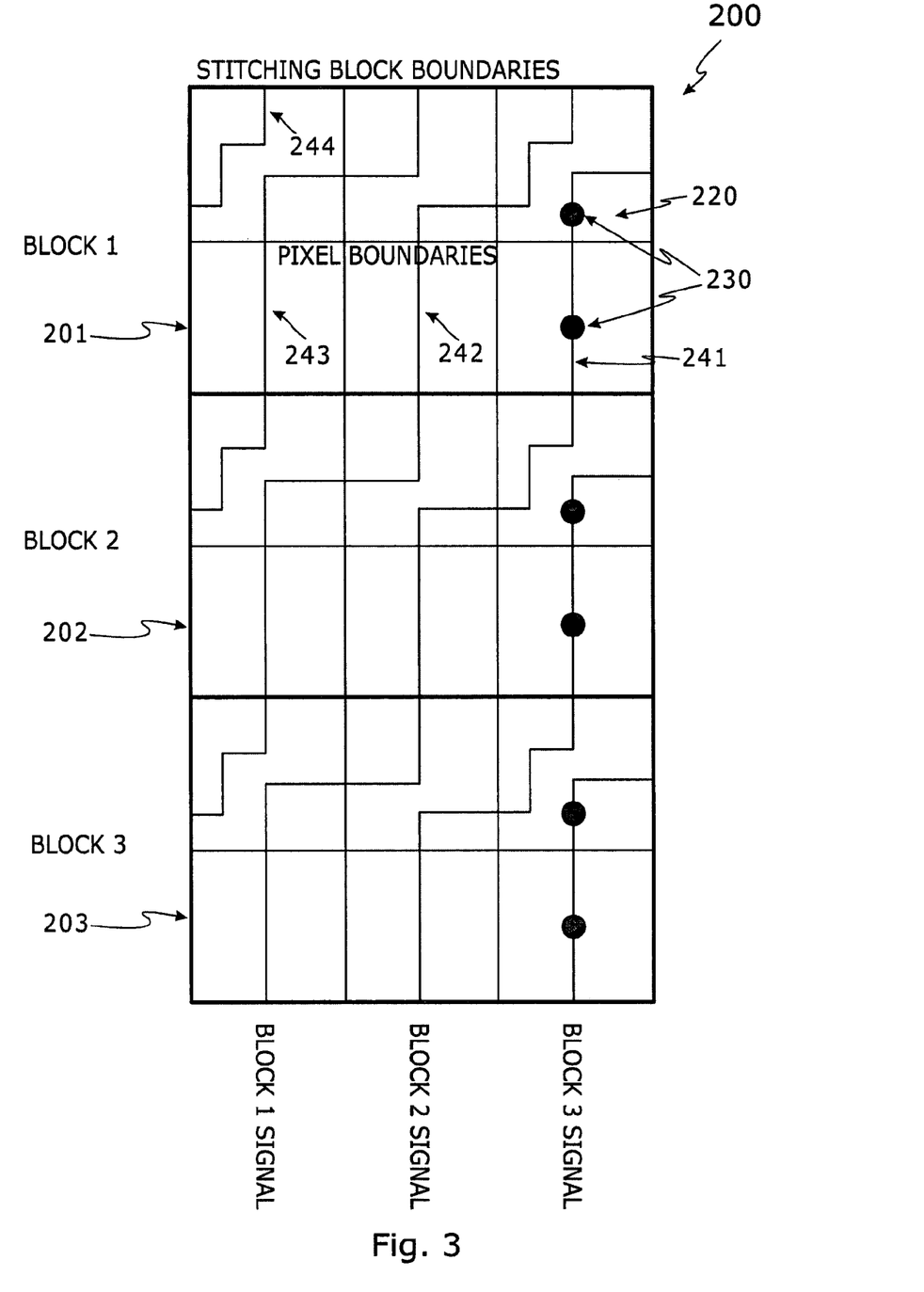
FIG. 3 illustrates a first embodiment of stitching blocks of an imaging sensor device in accordance with the present invention.

There is illustrated in FIG. 3, a first embodiment of stitching blocks of an imaging sensor device in accordance with the present invention. These may be implemented in order to effect the design shown in FIG. 2. The stitching blocks 200 shown are only part of the imaging sensor. The read-out circuitry and row addressing circuitry shown in FIG. 2 is omitted for clarity. There is shown a first stitching block 201, a second stitching block 202 and a third stitching block 203. Nevertheless, all three stitching blocks are in fact identical.

The first stitching block 201 comprises: pixel sensors 220 (although only one is labelled in the drawing) arranged in two rows; a first group addressing line segment 241; a second group addressing line segment 242; a third group addressing line segment 243; and a fourth group addressing line segment 244. Connections 230 are also provided to a first row of pixel sensors 220 in the first stitching block 201 and to a second row of pixel sensors 220 in the stitching block 201. It will be understood that these features are only shown in connection with the first stitching block 201, but they are repeated in respect of each of the other stitching blocks (second stitching block 202 and third stitching block 203).

Each of the group addressing line segments 241, 242, 243 and 244 has an L-shape or step-shape. Moreover, the group addressing line segments 241, 242, 243 and 244 are disposed so that the second group addressing line segment 242, third group addressing line segment 243 and the fourth group addressing line segment 244 will couple to other group addressing line segments in adjacent stitching blocks. For example, in the second stitching block 202, the third group addressing line segment 243 (not labelled in this block) couples to the second group addressing line segment 242 in the first stitching block 201. Moreover, the first group addressing line segment 241 in each stitching block uses contacts 230 to cause that addressing line to be coupled to the pixel sensors in that stitching block.

In this way, the group addressing lines couple from the logic circuitry at the bottom of the sensor array, up through stitching blocks. As these lines are staggered, they effectively run diagonally across the sensor array 200. This means that, if every stitching block connects to one of these lines at the same point, it is actually connected to a different signal at the bottom of the sensor array 200. The placement of stitch lines inside the sensor array 200 allows the addressing circuitry logic to be placed at the bottom edge of the sensor array 200. It will be understood that the row addressing lines are missing from FIG. 3, but are as shown in FIG. 2.

Figure 4:
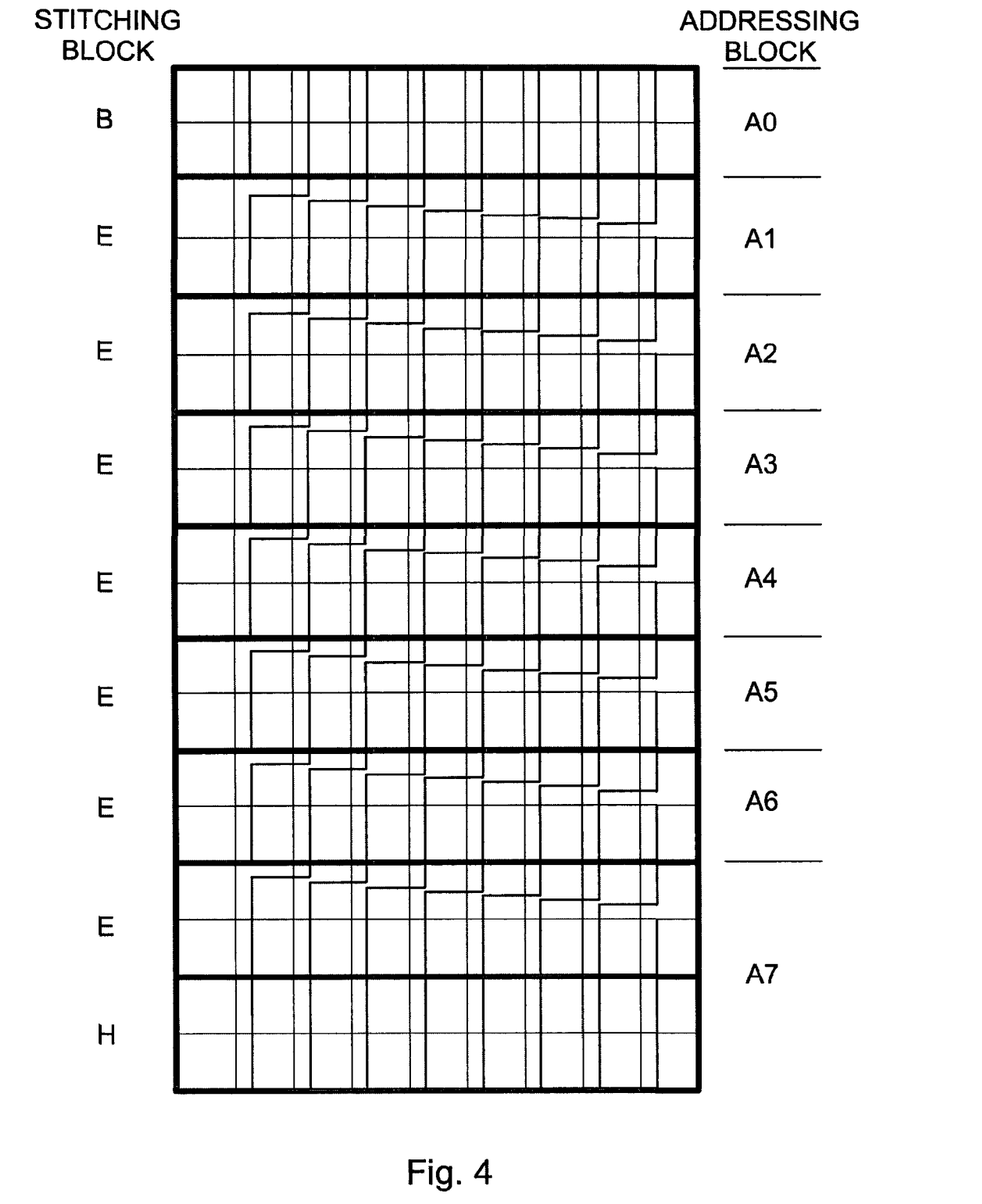
FIG. 4 shows a second embodiment of stitching blocks of an imaging sensor device in accordance with the present invention.

Referring now to FIG. 4, there is shown a second embodiment of stitching blocks in an imaging sensor device in accordance with the present invention. Again, only the group addressing line segments in each stitching block are shown. Three types of stitching block are shown. A first type of stitching block is labelled B, a second type of stitching block is labelled E, and a third type of stitching block is labelled H. In the completed sensor array, seven groups can individually be addressed. These are labelled A0, A1, A2, A3, A4, A5, A6 and A7. For each addressing block, a single group addressing line is provided at the base of the array. The second type of stitching block E is similar to those shown in connection with FIG. 3 and are the most commonly repeated type. The first type of stitching block B and the third type of stitching block H are used for edges of the sensor array. Thus, at least some of the stitching blocks have the same configuration of pixel sensors and addressing lines, although others may have a different configuration.

Using these configurations, each row may be selected using two signals. A first signal selects a row within a stitching block and a second signal selects a single stitching block. However, the combination of these two signals means that only one row in the whole sensor array is selected at any time. Means to implement this selection will now be discussed.

Figure 5:
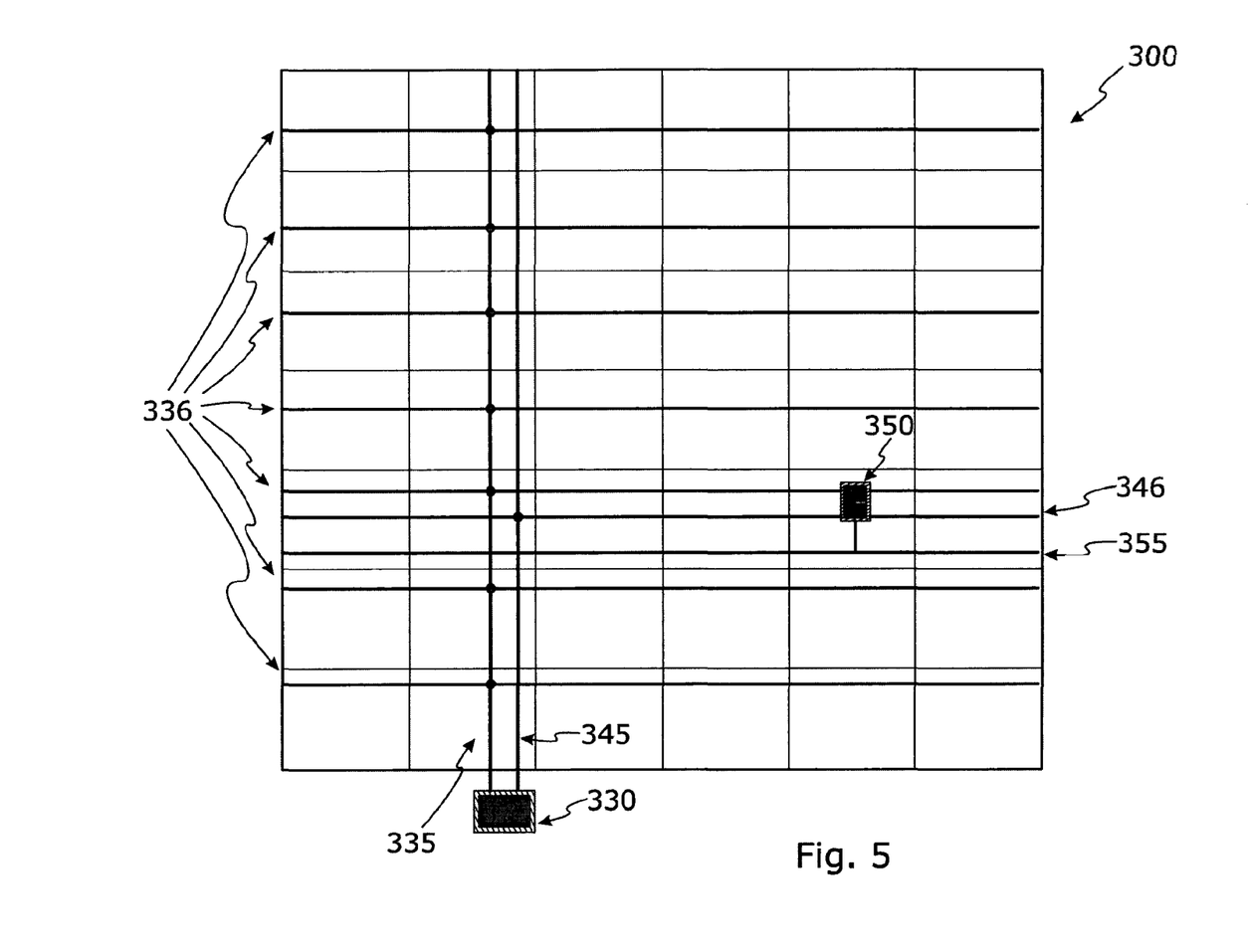
FIG. 5 shows more detail regarding the connections for the embodiments of FIGS. 3 and 4.

Referring now to FIG. 5, more detail is shown regarding the connections for the embodiments of FIG. 3 and FIG. 4. A sensor array 300 comprises a plurality of pixel sensors (not shown). Row addressing logic circuitry 330 is provided outside of the sensor array 300. In common with the configuration shown in FIG. 2, this circuitry is placed at the bottom of the sensor array 300. The row addressing circuitry 330 provides two signals: a row addressing signal 335; and a group addressing signal 345. The row addressing signal 335 is coupled to horizontal row addressing lines 336 in every identical stitching block. The group addressing signal 345 is only coupled to a single stitching block, via horizontal line 346. Other group addressing signals (not shown) are coupled to other specific stitching blocks. For each row of pixel sensors, a logic gate 350 is provided. This is coupled to the row addressing signal provided through horizontal line 336 and the group addressing signal provided through horizontal line 346. If both signals indicate a logical 'high' the logic gate 350 provides a selection signal onto horizontal line 355, which is connected to each pixel sensor along the row. This causes each pixel sensor along the row to send its read-out data.

The logic gate 350 is a single AND gate and is provided on every row of the device, with the group addressing signal as its input. This AND gate represents a slight variation in layout of the pixel sensors. Intelligent placement of the logic gates can mitigate any problems due to this effect. If the logic gates are distributed randomly, they will be almost invisible in the image output of the sensor array, and flat-field uniformity may be preserved. In practice, the position of the gates is known and identical from one sensor array to another. Thus, the distribution of the gates is effectively pseudo-random.

Figure 6:
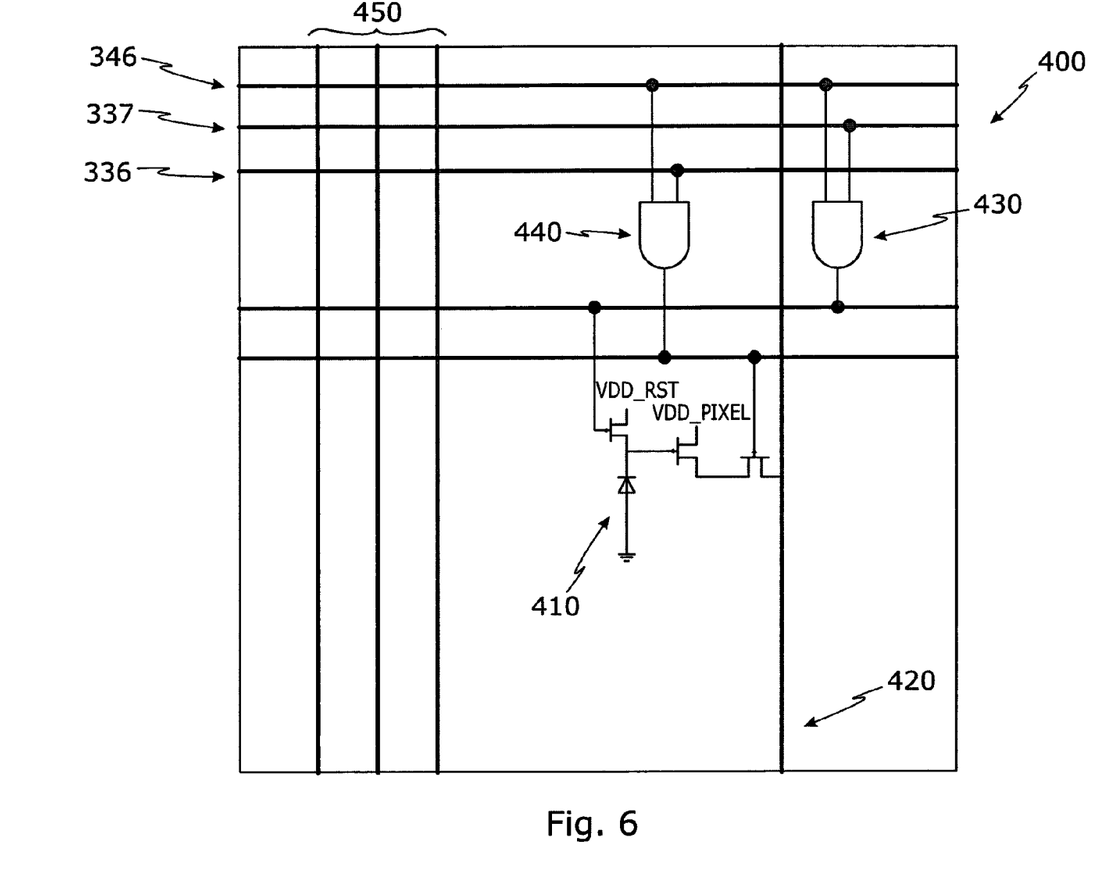
FIG. 6 details the arrangement of a single pixel sensor.

In FIG. 6, there is detailed the arrangement of a single pixel sensor 400. The pixel sensor 400 comprises: active pixel sensor circuitry 410; a read-out line 420; horizontal row addressing line 336; horizontal row reset line 337; horizontal group addressing line 346; first AND gate 430; and second AND gate 440. Also shown are auxiliary addressing lines 450, which are addressing lines intended for connection to other rows or row groups, but not for connection to the pixel sensor 400 shown.

A group addressing signal is coupled to the horizontal group addressing line 346 and this is provided as an input to both the first AND gate 430 and the second AND gate 440. A row addressing signal is coupled to the horizontal row addressing line 336 and this is provided as an input to the first AND gate 430 only. Thus, when both the group addressing signal and the row addressing signal indicate a logical high, the output of the first AND gate 430 is also a logical high and the pixel sensor 410 is caused to provide a read-out output on the read-out line 420. A row reset signal is coupled to the horizontal row reset addressing line 337 and this is provided as an input to the second AND gate 440 only. Hence, when both the group addressing signal and the row reset addressing signal indicate a logical high, the output of the second AND gate 440 is also a logical high and the pixel sensor 410 is caused to reset.

Figure 7:
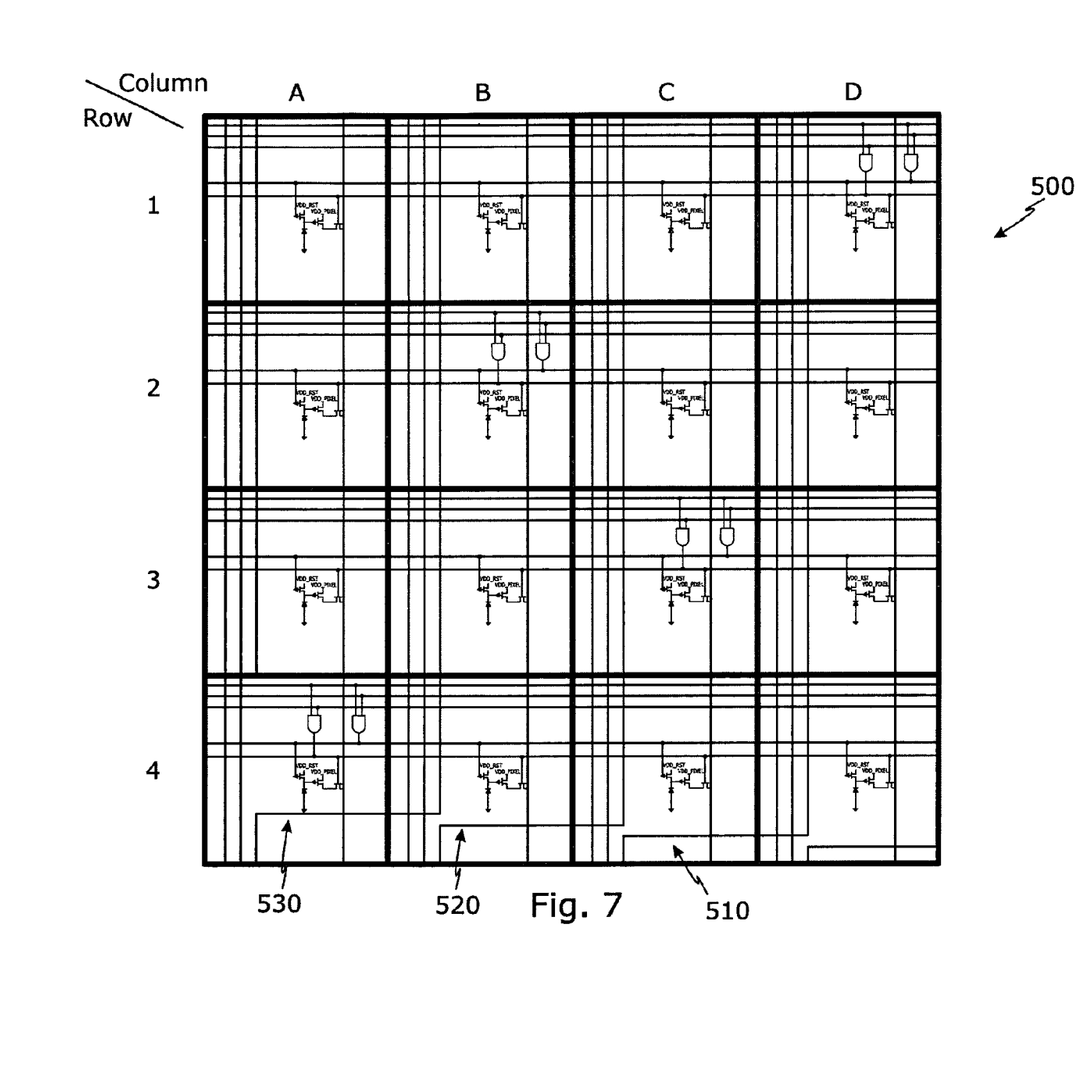
FIG. 7 illustrates the pixel sensors in accordance with FIG. 6 when arranged in a row group of a pixel sensor array.

FIG. 7 illustrates the pixel sensors in accordance with FIG. 6 when arranged in a row group 500 of a pixel sensor array. In particular, this exemplary row group 500 is an entire stitching block. The pixel sensors within the row group 500 are labelled by column from A to D and by row from 1 to 4. Thus pixel sensor A1 refers to the pixel sensor in column A and row 1. Similarly, pixel sensor C3 refers to the pixel sensor in column C and row 3, etc.

A group addressing signal for the row group 500 is provided on a first group addressing line 510. A group addressing signal for a row group in an identical stitching block positioned immediately above stitching block 500 is provided on a second group addressing line 520. Similarly, a group addressing signal for a row group in an identical stitching block positioned immediately above the stitching block located immediately above stitching block 500 is provided on a third group addressing line 530.

It will be seen that the row addressing lines and row reset addressing lines are coupled to individual rows in the pixels. In pixel sensor A1 the vertical lines carrying signals for the first row are coupled to corresponding horizontal lines. Similarly, in pixel sensor B2 the vertical lines carrying signals for the second row are coupled to corresponding horizontal lines. In pixel sensor C3, the vertical lines carrying signals for the third row are coupled to corresponding horizontal lines. Finally, the vertical lines carrying signals for the fourth row are coupled to corresponding horizontal lines in pixel sensor D4. In this way, individual rows within the row group 500 may be addressed for read-out or reset.

The first group addressing line is coupled to a horizontal line in every row of pixel sensors. This connection is shown in pixel sensors D1, D2, D3 and D4. The AND gates are distributed in a pseudo-random fashion across the stitching block, in pixel sensors D1, B2, C3 and A4. In a larger-scale stitching block, with a much greater number of pixel sensors, such a pseudo-random distribution of AND gates would be more noticeable.

In designs as described herein, a standard stitching process can be used. Complex stepping processors are not needed. Moreover, all of the pixel sensors have the same level of sensitivity. Shift registers along the length of the array are not necessary to effect read-out. Use of such shift registers may lead to light-insensitive stripes forming in the output signal, which may be removed using image processing software. Moreover, the use of one AND logic gate per row may effect reduced power consumption. A flip-flop forming part of a shift register can consume significantly more power than this arrangement.

Figure 8:
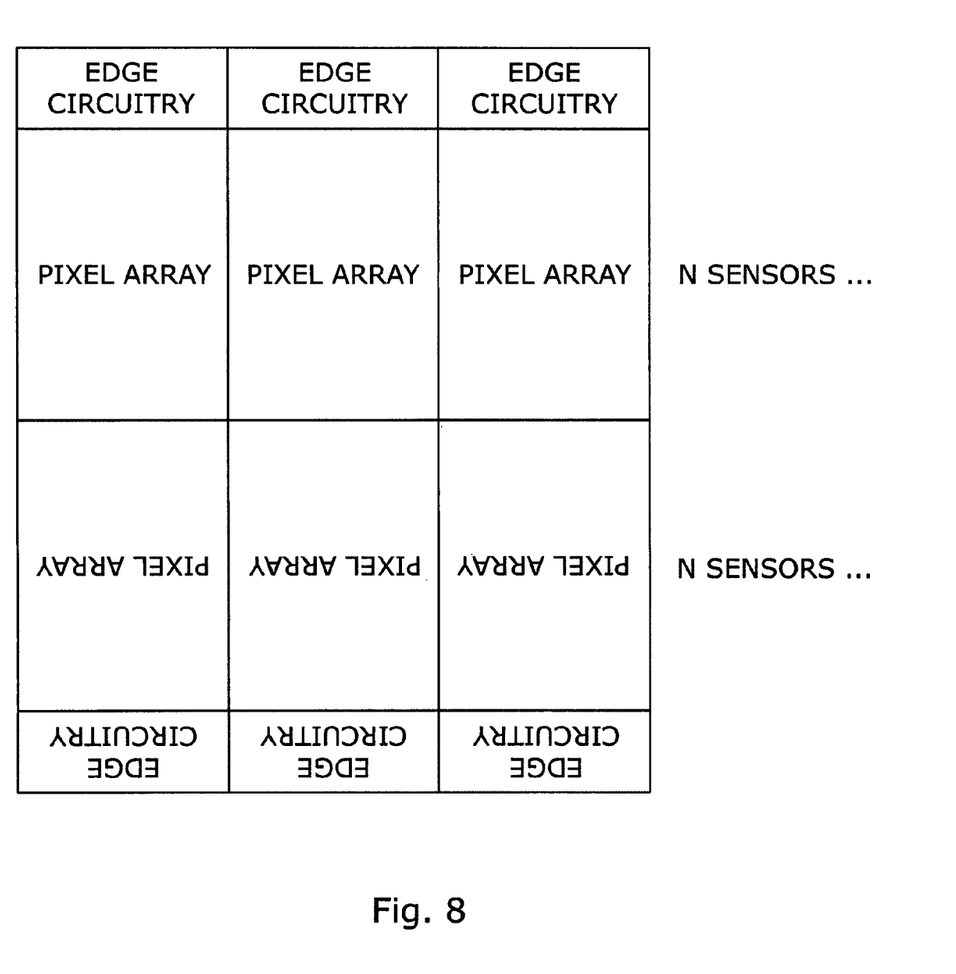
FIG. 8 depicts an embodiment of a composite pixel sensor.

It will be understood that a composite imaging sensor device can then be created by arranging each of these imaging sensor devices in a 2×N structure, with the addressing and read-out circuitry located on opposite edges for each opposing pair of sensor arrays. Since three sides of the array are buttable, there is theoretically no limit on N and any integer value is possible. FIG. 8 depicts an embodiment of a composite pixel sensor. The pixel sensor arrays are arranging pairs. The sensor arrays are positioned and oriented so that the edge circuitry (comprising addressing circuitry and read-out circuitry) of the pixel sensor arrays are located on opposite sides along one dimension (vertical in FIG. 8) of the composite structure. The edge circuitry of the pixel sensor arrays along the other dimension (horizontal in FIG. 8) are located on the same side of the composite structure. Thus, the 2×N structure is formed.

Whilst preferred embodiments have been described above, the skilled person will recognise that various modifications and variations are possible. For example, each stitching block may be divided into a plurality of row groups. Then, rather than providing a single group addressing line for each stitching block, there is a single addressing line for each row group. In this way, there may be more than one group addressing line coupled to pixels in each stitching block.

Some of the group addressing lines may be connected to more than one row group or stitching block for specific applications. Similarly, one or more of the row addressing lines may be connected to more than one row in each row group or stitching block. Additionally or alternatively, some of the row groups or stitching blocks might not be connected to any group addressing lines, row addressing lines or both. Different types of imaging sensor can be effected.

Rather than an AND logic gate, other types of logic gate circuitry might be used, for example NAND.

In a further development, a second group addressing line signal can be provided for each row group or block, instead of or in addition to a second row addressing line, as shown in FIGS. 6 and 7. This second line may act as a reset signal for a row group, for example. It may be possible thereby to simultaneously select one row in one row group and reset one row in another row group. Further group addressing line signals for other applications may be envisaged, if desirable.

The invention claimed is:

1. An imaging sensor device, comprising:
an array of pixel sensors arranged in rows and columns, the array comprising: a plurality of stitching blocks, each stitching block comprising a plurality of pixel sensors disposed in at least one row group; and first and second groups of addressing lines for addressing the pixel sensors, the arrangement of pixel sensors and addressing lines in each of the stitching blocks being the same;
row addressing circuitry external to the array, disposed along an edge of the array parallel to the rows of pixel sensors, coupled to the pixel sensors using the first group of addressing lines and configured to perform a row addressing action in which a single corresponding row in each of the row groups of each stitching block is simultaneously addressed; and
group addressing circuitry external to the array, disposed along the same edge of the array as the row addressing circuitry, coupled to the pixel sensors using at least some of the second group of addressing lines and configured to perform a group addressing action in which all of the rows in a single row group of a single stitching block are simultaneously addressed; and
wherein each stitching block is further arranged to combine a row addressing action with a group addressing action such that only one row of one row group of one stitching block is selected simultaneously.

2. The imaging sensor of claim 1, wherein each stitching block comprises a plurality of second addressing line segments at least some of which are each arranged to couple with a respective second addressing line segment of an adjacent stitching block, the second addressing line segments coupled forming the second group of addressing lines.

3. The imaging sensor of claim 2, wherein each row group has a single respective second addressing line segment coupled to it in each stitching block.

4. The imaging sensor of claim 2, wherein the stitching blocks are arranged in at least one column, the number of row groups in the column being no greater than the number of second addressing line segments in each stitching block.

5. The imaging sensor of claim 1, wherein each stitching block further comprises a logic gate for each pixel sensor of the stitching block coupled to a respective one of the first addressing lines and a respective one of the second addressing lines, so as to combine the row addressing action and group addressing actions.

6. The imaging sensor of claim 5, wherein the position of each logic gate in relation to the respective pixel sensor of the stitching block is not the same.

7. The imaging sensor of claim 6, wherein the positions of the plurality of logic gates in each stitching block are distributed pseudo-randomly.

8. The imaging sensor of claim 1, wherein the array of pixel sensors further comprises a group of read-out lines, each read-out line being arranged to provide a combined signal from a single pixel sensor of each of a plurality of rows in the array.

9. The imaging sensor of claim 8, wherein the arrangement of read-out lines in each of the stitching blocks is the same.

10. The imaging sensor of claim 8, further comprising read-out circuitry external to the array, disposed along the same edge of the array as the row addressing circuitry and coupled to the pixel sensors using the group of read-out lines.

11. The imaging sensor of claim 1,
wherein the array of pixel sensors further comprises a third group of addressing lines for addressing the pixel sensors;
wherein the group addressing circuitry is further coupled to the pixel sensors using at least some of the third group of addressing lines and configured to perform a second group addressing action using the third group of addressing lines in which all of the rows in a single row group of a single stitching block are simultaneously addressed; and
wherein each stitching block is further arranged to combine a row addressing action with a second group addressing action such that only one row of one row group of one stitching block is selected simultaneously.

12. The imaging sensor of claim 11, wherein the combination of the row addressing action and the second group addressing action causes pixel sensors in the selected row to be reset.

13. The imaging sensor of claim 11, wherein the first group addressing action and the second group addressing action may be effected simultaneously.

14. The imaging sensor of claim 1, wherein no circuitry is disposed adjacent the edges of the pixel array other than the edge along which the row addressing circuitry is disposed.

15. A composite imaging sensor device, comprising a plurality of imaging sensor devices arranged in opposing pairs, each imaging sensor device being in accordance with claim 1.

16. A method of providing an imaging sensor device, comprising:
arranging pixel sensors in an array of rows and columns, the array comprising: a plurality of stitching blocks, each stitching block comprising a plurality of pixel sensors disposed in at least one row group; and first and second groups of addressing lines for addressing the pixel sensors, the arrangement of pixel sensors and addressing lines in each of the stitching blocks being the same;
providing row addressing circuitry external to the array, disposed along an edge of the array parallel to the rows of pixel sensors, coupled to the pixel sensors using the first group of addressing lines and configured to perform a row addressing action in which a single corresponding row in each of the row groups of each stitching block is simultaneously addressed; and
group addressing circuitry external to the array, disposed along the same edge of the array as the row addressing circuitry, coupled to the pixel sensors using at least some of the second group of addressing lines and configured to perform a group addressing action in which all of the rows in a single row group of a single stitching block are simultaneously addressed; and
wherein each stitching block is further arranged to combine a row addressing action with a group addressing action such that only one row of one row group of one stitching block is selected simultaneously.

17. The method of providing an imaging sensor device according to claim 16, wherein the step of arranging pixel sensors comprises forming at least some of the plurality of stitching blocks using identical processing steps.

18. The method of providing an imaging sensor device according to claim 17, wherein the at least some of the plurality of stitching blocks are formed using the same photolithographic process.

* * * * *